United States Patent
Van Blokland et al.

(10) Patent No.: US 10,600,672 B2
(45) Date of Patent: Mar. 24, 2020

(54) BACKEND TAPING USING FLUID ASSISTED FIXATION

(71) Applicant: Nexperia B.V., Nijmegen (NL)

(72) Inventors: Boudewijn Van Blokland, Nijmegen (NL); Tom Kok, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 13 days.

(21) Appl. No.: 15/283,876

(22) Filed: Oct. 3, 2016

(65) Prior Publication Data

US 2017/0162419 A1 Jun. 8, 2017

(30) Foreign Application Priority Data

Dec. 3, 2015 (EP) ..................... 15197754

(51) Int. Cl.
*H01L 21/683* (2006.01)
*B65B 9/04* (2006.01)
*B65B 15/04* (2006.01)
*H05K 13/00* (2006.01)
*H01L 21/677* (2006.01)

(52) U.S. Cl.
CPC ............ *H01L 21/6836* (2013.01); *B65B 9/04* (2013.01); *B65B 9/042* (2013.01); *B65B 9/045* (2013.01); *B65B 15/04* (2013.01); *H01L 21/6773* (2013.01); *H05K 13/0084* (2013.01)

(58) Field of Classification Search
CPC ............ H01L 21/6836; H01L 21/6773; H05K 13/0084; B65B 9/04; B65B 9/042; B65B 9/045

USPC ........................................... 29/739, 729, 700
See application file for complete search history.

(56) References Cited

U.S. PATENT DOCUMENTS

| 5,729,963 A * | 3/1998 | Bird .................. B65B 9/04 53/471 |
| 6,101,790 A | 8/2000 | Mori et al. |
| 6,332,268 B1 | 12/2001 | Imanishi et al. |
| 2002/0005294 A1* | 1/2002 | Mayer ................. B82Y 30/00 174/260 |
| 2011/0291302 A1* | 12/2011 | Mueller .............. H01L 24/75 257/783 |

FOREIGN PATENT DOCUMENTS

JP  05198615 A * 8/1993
WO  20140015891 A1  1/2014

* cited by examiner

*Primary Examiner* — Peter Dungba Vo
*Assistant Examiner* — Azm A Parvez
(74) *Attorney, Agent, or Firm* — Ohlandt, Greeley, Ruggiero & Perle, L.L.P.

(57) ABSTRACT

A method comprising; transferring a holding liquid into at least one pocket of a carrier tape, the at least one pocket comprising a recess within the carrier tape configured to receive an electronic component; placing an electronic component into the at least one pocket whereby the holding liquid acts to retain the electronic component within the pocket; and applying a sealing tape over the carrier tape to close the pocket with the electronic component therein.

12 Claims, 1 Drawing Sheet

401 — transferring a holding liquid into at least one pocket of a carrier tape

402 — placing an electronic component into the at least one pocket

403 — applying a sealing tape over the carrier tape to seal the electronic component within the pocket

BACKEND TAPING USING FLUID ASSISTED FIXATION

CROSS-REFERENCE TO RELATED APPLICATIONS

This application claims priority under 35 U.S.C. § 119 of European Patent application no. 15197754.3, filed on 3 Dec. 2015, the contents of which are incorporated by reference herein.

The present disclosure relates to the field of tape packaging electronic components. The present disclosure relates to an apparatus and associated method for retaining an electrical component in a pocket of a carrier tape by way of a holding liquid placed within the pocket.

BRIEF SUMMARY OF THE INVENTION

One of the final steps of production of an electronic component may be placing the finished electronic component within a tape for use in tape and reel PCB assembly devices. Thus, each of a plurality of electronic components may be placed within each of a plurality of pockets formed at spaced locations within the tape. Each electronic components may then be closed within its respective pocket for distribution and transport, for example.

According to a first aspect of the present disclosure there is provided an apparatus configured to;
provide for transfer of a holding liquid into at least one pocket of a carrier tape, the at least one pocket comprising a recess within the carrier tape configured to receive an electronic component; and
provide for placement of an electronic component into the at least one pocket whereby the holding liquid acts to retain the electronic component within the pocket; and
provide for application of a sealing tape over the carrier tape to close the pocket with the electronic component therein.

The apparatus may comprise a controller for a tape packaging apparatus. Accordingly, the apparatus may provide signalling to control a tape packaging apparatus to provide for the above functions. The apparatus may comprise a tape packaging apparatus including means to perform the above functions.

In one or more embodiments, the apparatus is configured to provide for evaporation of the holding liquid out of the at least one pocket by permeation of the holding liquid through one or more of the carrier tape and the sealing tape.

In one or more embodiments, the apparatus may provide for evaporation of the holding liquid by heating the at least one closed pocket (the pocket closed by the sealing tape) or by reduction of the pressure outside the at least one closed pocket relative to the pressure inside the at least one closed pocket.

In one or more embodiments, the apparatus comprises a tape packaging apparatus and includes an indexing element to move the carrier tape through the apparatus, the indexing element configured to present the or each pocket of the carrier tape to a holding liquid transfer element of the apparatus to provide for transfer of the holding liquid to the pocket and, subsequently, to a pick and place head for placement of the electronic component into the pocket to contact the holding liquid placed therein by the holding liquid transfer element and, subsequently, to a sealing tape application element to provide for the application of the sealing tape over the carrier tape.

In one or more embodiments, the apparatus includes a holding liquid transfer element to provide for transfer of the holding liquid to the pocket. In one or more embodiments, the holding liquid transfer element comprises a liquid dispensing head configured to align with the at least one pocket and dispense the holding liquid to provide for transfer of the holding liquid into the at least one pocket of the carrier tape. In one or more embodiments, the liquid dispensing head is configured to print the holding liquid into the at least one pocket of the carrier tape. In one or more embodiments, the liquid dispensing head is an ink jet type head.

In one or more embodiments, the apparatus includes a pick and place head configured to provide for placement of the electronic component into the at least one pocket.

In one or more embodiments, the apparatus is configured to receive the carrier tape including an aperture located in the at least one pocket that extends through the carrier tape, the apparatus including a liquid tray configured to present the holding liquid to the carrier tape, the apparatus configured to provide for dipping of the aperture of the at least one pocket into the holding liquid in the liquid tray thereby providing for the transfer of holding liquid into the pocket by capillary action through the aperture. Thus, the holding liquid transfer element, in this embodiment, comprises the liquid tray and a dipping element to provide for the dipping of the aperture into the holding liquid in the tray.

According to a second aspect of the present disclosure there is provided a method comprising;
transferring a holding liquid into at least one pocket of a carrier tape, the at least one pocket comprising a recess within the carrier tape configured to receive an electronic component;
placing an electronic component into the at least one pocket whereby the holding liquid acts to retain the electronic component within the pocket; and
applying a sealing tape over the carrier tape to close the pocket with the electronic component therein.

The method may therefore comprise a method of tape packaging an electronic component.

In one or more embodiments, the method includes evaporating the holding liquid out of the at least one pocket by permeation of the holding liquid through one or more of the carrier tape and sealing tape.

The evaporating may be provided by heating or pressure changes.

In one or more embodiments, the method includes transferring the holding liquid by one or more of;
dispensing the holding liquid into the at least one pocket;
spraying the holding liquid into the at least one pocket;
applying the holding liquid to the electronic component which is transferred to the at least one pocket when the electronic component is placed therein;
jetting the holding liquid into the at least one pocket; or
dipping carrier tape into the holding liquid to provide for transfer of the holding liquid into the at least one pocket by capillary action.

In one or more embodiments, the holding liquid is transferred to a base of the pocket.

In one or more embodiments, the holding liquid is transferred to the pocket to only partially fill the pocket. In one or more embodiments, the holding liquid is transferred to the pocket to fill the pocket to less than 20% of the volume of the pocket. In one or more embodiments, the holding liquid fills the pocket to less than 10%, 8%, 6%, 4%, 2%, or 1% of the volume of the pocket. In one or more embodiments, the holding liquid fills the pocket to greater than 5%, 2%, or 1% of the volume of the pocket. Ranges of percentages may be formed from appropriate upper and lower bounds stated above.

In one or more embodiments, placing the electronic component comprises placing the electronic component directly onto the holding liquid present within the pocket.

In one or more embodiments, applying the sealing tape comprises placing the sealing tape over the carrier tape at a position that covers an open end of the at least one pocket and applying thermo-compression between the sealing tape and carrier tape.

According to a third aspect of the present disclosure there is provided a computer program or computer program product comprising computer program code which when executed by a processor having memory causes an tape packaging apparatus to perform the method of the second aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Due to ever shrinking electronic component size and ever increasing production speed, external forces have become a key factor influencing tape packaging reliability and quality. External forces such as static electricity, air flow during tape packaging, contact forces with pick and place tools used for tape packaging and acceleration forces during indexing of the tape during tape packaging may lead to reliability problems. For example, the die of the electronic component may be tilted with the pocket, the pocket may be empty and/or damage may be caused to the tape.

Figure 1:
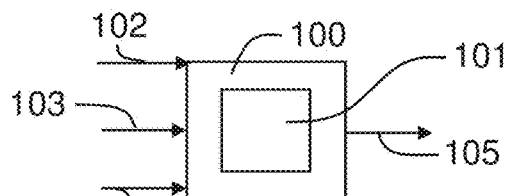
FIG. 1 shows an example embodiment of an apparatus for tape packaging an electronic component.

FIG. 1 shows, schematically, a tape packaging apparatus 100 having a controller 101 to provide for control of at least part of its operation. The controller 101 may comprise hardware, software or firmware. The controller may comprise a processor having memory on which computer program code is executed to provide signalling that controls elements of the tape packaging apparatus, as described below. The tape packaging apparatus 100 may receive, at 102, a carrier tape having a plurality of pockets therein and a sealing tape. The tape packaging apparatus 100 may receive, at 103, electronic components for placing within the plurality of pockets. The tape packaging apparatus 100 may receive, at 104, a supply of holding liquid for transfer into the plurality of pockets to hold the electronic components within the pockets during subsequent processing steps.

The output of the apparatus 100, shown at 105, may comprise the carrier tape having an electronic component with each of the pockets and the pockets closed by the sealing tape. The apparatus 100 may include a heater to provide for evaporation of the holding liquid out of the closed pockets.

Figure 2:
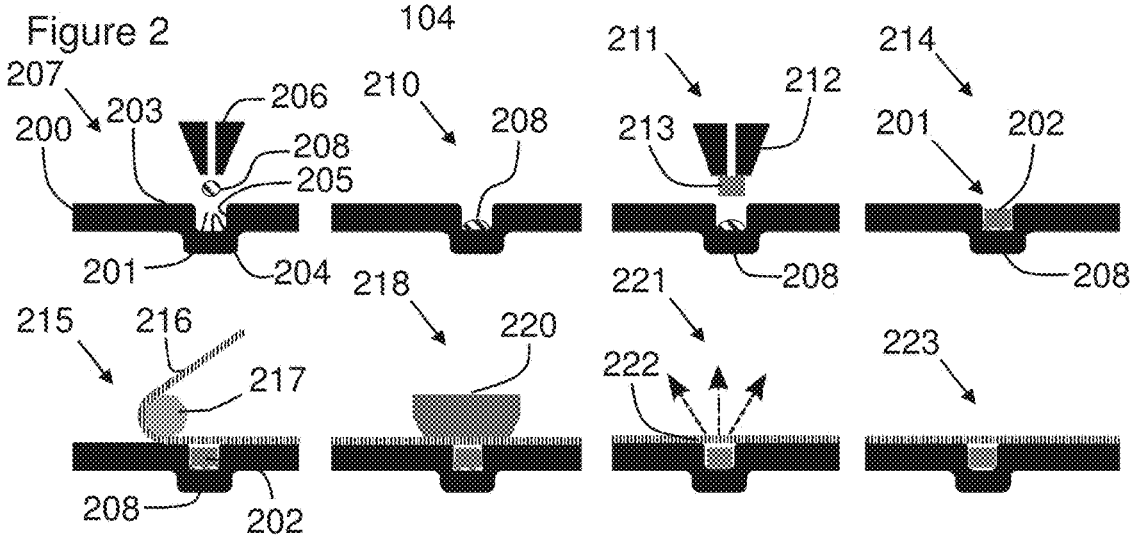
FIG. 2 shows an example process flow.

FIG. 2 schematically shows an example series of steps to provide for the tape packaging of electronic components using holding liquid. FIG. 2 shows a carrier tape 200 in cross-section. The carrier tape 200 includes a plurality of pockets 201 formed therein for receiving electronic components 202. The pocket(s) comprise a recess within the carrier tape 200 that may be positioned at spaced locations along the carrier tape 200. The pockets 201 may comprise, as shown in FIG. 2, depressions in a major surface 203 of the carrier tape and may include a base 204 and side walls 205 between the base 204 and the major surface 203.

The apparatus 100 may include a holding liquid transfer element to provide for transfer of a holding liquid into at least one pocket of a carrier tape. In this example, shown in FIG. 2, the holding liquid transfer element comprises a liquid dispensing head 206.

Thus, at step 207, on receipt of the carrier tape 200, the electronic components 202 and the holding fluid 104, the liquid dispensing head 206 is configured to align with each pocket 201 of the carrier tape 200 and dispense the holding liquid 208 into the pocket. The liquid dispensing head may be configured to print the holding fluid into each of the pockets. Accordingly, the liquid dispensing head may be an ink jet type head, although other printing heads may be used. The printing head may use a gaseous propellant, heat, hydraulic action or other means to dispense the holding fluid into the pocket 201. The dispensing of the holding liquid into the at least one pocket may comprise spraying the holding liquid into the pocket or jetting the holding liquid into the pocket.

Step 210 shows the droplet of holding liquid 208 within the pocket and located at the base 204 of the pocket 201. The holding liquid 208 may, by virtue of surface tension/static forces, spread over the base 204 of the pocket 201. It will be appreciated that the drop of holding fluid 208 may be deposited directly onto the base 204 or it may be deposited such that it flows to the base 204. In some examples, the holding fluid 208 is provided on the side wall 205. The carrier tape 200 may be oriented such that gravity assists the droplet 208 in reaching the base 204.

The holding liquid 208 only partially fills the pocket leaving space for the electronic component without extending out of the pocket, such as beyond a level of the major surface 203. It will be appreciated that the amount of holding liquid required may be sufficient to engage and retain and the electronic component while leaving space for the electronic component. In some examples the holding liquid fills the pocket to less than 10% of the volume of the pocket.

Step 211 shows a pick and place head 212 configured to provide for placement of a single electronic component 213 into the pocket 201. The pick and place head 212 may physically grip the electronic component 215 or may use pressure to hold and release the electronic component 213. It will be appreciated that any other type of pick and place head may be used that is able to place the electronic component in the pocket.

The pick and place head 212 may be configured to align with the pocket 201 such that the electronic component is placed directly onto the holding liquid 208 present within the pocket 201.

Step 214 shows the electronic component 213 sitting within the pocket 201 and retained therein by the holding liquid 208. It will be appreciated that the holding liquid may, by virtue of surface tension and/or hydrophilicity towards the material of the pocket and electronic component, provide a holding force to retain the electronic component within the pocket. The holding liquid may have adhesive properties. Examples of holding liquids include alcohol, alcohol solution or deionised water.

The holding liquid may be configured to be non-curable or non-setting. The holding liquid may be configured to remain in liquid form until it is removed from the pocket, as will be described below.

The retaining properties of the holding liquid may be advantageous during the subsequent tape packaging steps. The apparatus 100 may include an indexing element to move the carrier tape 200 through the apparatus 100. The indexing element may move the carrier tape 200 for registration with the holding liquid transfer element 206 and pick and place head 212. The holding liquid may act to retain the electronic components 213 within their respective pockets despite the motion imparted on the carrier tape by the indexing element.

Step 215 shows the application of a sealing tape 216 over the major surface 203 of the carrier tape 200 in order to hold the electronic components 202 within the pockets 203. In this example, a roller 217 of the apparatus 100 is configured to receive the sealing tape 216 and roll it over the carrier tape 200 over an open end of the pocket 201.

Step 218 shows a thermo-compression element 220 configured to engage the sealing tape 216 at a location around each pocket 201 to affix the sealing tape 216 to the carrier tape 200 and thereby close the pocket 201 with the electronic component 202 inside. The heat and compressive force provided by the thermo-compression element 220 may bond the sealing tape 216 to the carrier tape 200. The holding liquid is also present within the pocket 201 when the sealing tape is applied.

Step 221 shows the evaporation of the holding liquid 208 out of the closed pocket 222 by permeation of the holding liquid through one or more of the carrier tape 200 and sealing tape 216. Thus, the permeability of the carrier tape and/or sealing tape may be such that the holding liquid can evaporate therethrough. The carrier tape and/or sealing tape may include perforations such as micro-perforations to aid the evaporation or transfer of the holding liquid or a vapour thereof through the material of the tape 200/216. Example material of the carrier tape and/or sealing tape comprises polystyrene, paper based tape, or polycarbonate based tape among others.

In this example the apparatus 100 may provide for evaporation of the holding liquid by heating the closed pocket. For example, a curing step may be applied in which the temperature of the curing step is sufficient to evaporate the holding liquid.

In some examples, the evaporation of the holding liquid may be affected by control of the relative pressures inside and outside of the closed pocket 222. Thus, the apparatus 100 may be configured to reduce the pressure outside the closed pocket 222 relative to the pressure inside the closed pocket 222. The use of pressure or temperature may encourage the holding liquid to diffuse through the carrier tape/sealing tape.

Step 223 shows the closed pocket 222 with the holding liquid absent from the pocket 103 due to its substantially complete evaporation or permeation through the sealing tape 216 and/or carrier tape 200.

Figure 3:
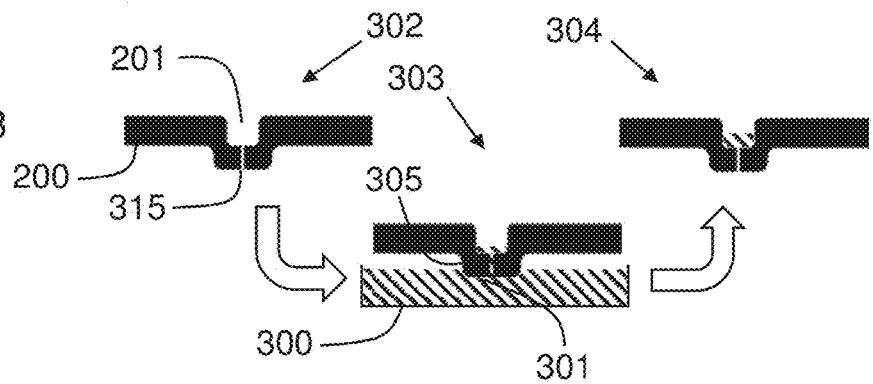
FIG. 3 shows an example process flow.

FIG. 3 shows an alternative to step 207. In FIG. 3, the holding liquid transfer element comprises a dipping element (not shown) and a holding liquid tray 300 containing holding liquid 301. The dipping element is configured to move the pocket 201 of the carrier tape 200 relative to the tray 300 such that the pocket is dipped into the holding liquid. Step 302 shows the carrier tape prior to dipping by the dipping element, step 303 shows the pocket in contact with the holding liquid and step 304 shows the holding liquid within the pocket 201. The dipping element provides for movement of the carrier tape and/or tray 300 to adopt the positions shown by steps 302, 303 and 304. The dipping element may form part of the indexing element.

The dipping element is configured to be used in combination with a carrier tape 200 having apertures 305 through the carrier tape and into the pocket 201. The apertures 305 may be sufficiently narrow for capillary action of the holding liquid to be sufficient to transfer the holding liquid from the tray 300 to the pocket 201 through the aperture 305. The aperture 305 may have a width of less than 1 mm or less than 0.1 mm.

It will be appreciated that the indexing element may be configured to move the carrier tape 200 through the apparatus 100 to one or more of the elements that provide steps 207, 210, 211, 214, 215, 218, 221, 223, 302, 303, 304. Thus, the indexing element may be configured to present each pocket 201 of the carrier tape 200 to the holding liquid transfer element 206 and, subsequently, to the pick and place head 212 and, subsequently, to a sealing tape application element (roller 217) and, subsequently, to an optional thermo-compression head 220. It will be appreciated that in some examples the sealing tape may be self-adhesive and therefore the thermo-compression head may not be required. The indexing element may further present the closed pockets to an evaporation element, such as a heater, to perform the step 221.

The apparatus may provide for loading of the completed tape, with closed pockets, onto a reel (not shown).

Figure 4:
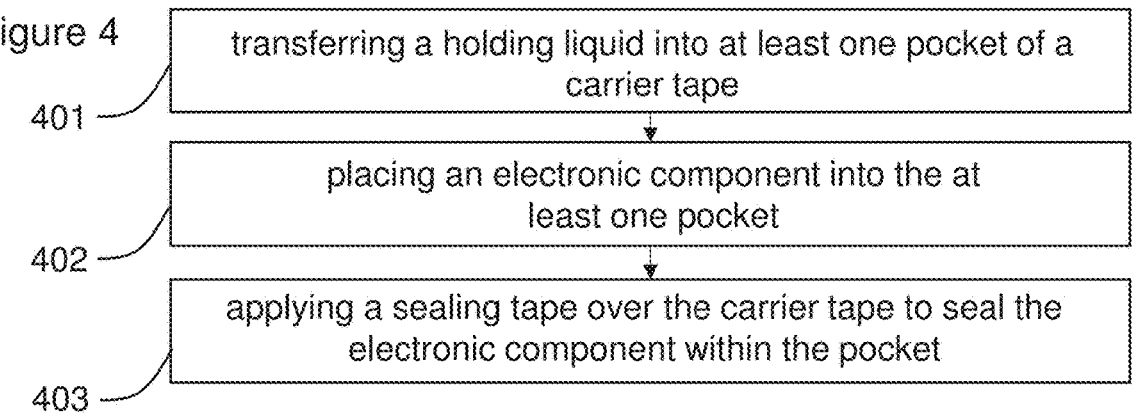
FIG. 4 shows an example flow chart illustrating a method.

FIG. 4 shows a flow chart illustrating the method of transferring 400 a holding liquid into at least one pocket of a carrier tape, the at least one pocket comprising a recess within the carrier tape configured to receive an electronic component; placing 401 an electronic component into the at least one pocket whereby the holding liquid acts to retain the electronic component within the pocket; and applying 402 a sealing tape over the carrier tape to close the pocket with the electronic component therein.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A tape packaging apparatus comprising:
   a transfer element for transferring a non-curable holding liquid into at least one pocket of a carrier tape, the at least one pocket comprising a recess within the carrier tape configured to receive an electronic component;
   a placing element for placing an electronic component into the at least one pocket, whereby the holding liquid acts to retain the electronic component within the recess at least one pocket;
   a sealing tape application element for applying a sealing tape over the carrier tape to close the at least one pocket with the electronic component therein; and
   a heater for heating the at least one closed pocket to evaporate the holding liquid out of the at least one closed pocket by permeation of the holding liquid through the carrier tape or the sealing tape or both.

2. The apparatus according to claim 1, wherein the apparatus further comprises:
   an indexing element configured to move the carrier tape through the apparatus, the indexing element being configured to present each pocket of the carrier tape to a holding liquid transfer element of the apparatus to transfer the holding liquid to the pocket and, subsequently, to a pick head to place an electronic component into the at least one pocket to contact the holding liquid placed therein by the holding liquid transfer element and, subsequently, to the sealing tape application element configured to apply of the sealing tape over the carrier tape.

3. The apparatus according to claim 1, wherein the apparatus comprises a liquid dispensing head configured to align with the at least one pocket and dispense the holding liquid to provide for the transfer of the holding liquid into the at least one pocket of the carrier tape.

4. The apparatus according to claim 1, wherein the apparatus comprises a pick and place head configured to provide for the placement of the electronic component into the at least one pocket.

5. The apparatus according to claim 1, wherein the apparatus is configured to receive the carrier tape including an aperture located in the at least one pocket that extends through the carrier tape, the apparatus including a liquid tray configured to present the holding liquid to the carrier tape, the apparatus configured to dip the aperture of the at least one pocket into the holding liquid in the liquid tray thereby providing for the transfer of holding liquid into the pocket by capillary action through the aperture.

6. A method comprising:
   transferring a non-curable holding liquid into at least one pocket of a carrier tape with a transfer element, the at least one pocket comprising a recess within the carrier tape configured to receive an electronic component;
   placing an electronic component into the at least one pocket with a placing element, whereby the holding liquid acts to retain the electronic component within the pocket;
   applying a sealing tape over the carrier tape with a sealing tape application element to close the pocket with the electronic component therein, and
   heating the at least one closed pocket to evaporate the holding liquid out of the at least one closed pocket by permeation of the holding liquid through one or more of the carrier tape and sealing tape.

7. The method of claim 6, in which the method includes transferring the holding liquid by one or more of a group comprising:
   dispensing the holding liquid into the at least one pocket,
   spraying the holding liquid into the at least one pocket,
   applying the holding liquid to the electronic component which is transferred to the at least one pocket when the electronic component is placed therein,
   jetting the holding liquid into the at least one pocket, and
   dipping carrier tape into the holding liquid to provide for transfer of the holding liquid into the at least one pocket by capillary action.

8. The method of claim 6, in which holding liquid is transferred to a base of the pocket.

9. The method of claim 6, in which holding liquid is transferred to the pocket to only partially fill the pocket.

10. The method of claim 9, in which holding liquid is transferred to the pocket to fill the pocket to less than 10% of the volume of the pocket.

11. The method of claim 6, in which placing the electronic component comprises placing the electronic component directly onto the holding liquid present within the pocket.

12. The method of claim 6, in which applying a sealing tape comprises placing the sealing tape over the carrier tape at a position that covers an open end of the at least one pocket and applying thermo-compression between the sealing tape and carrier tape.

* * * * *